(12) United States Patent
Hosenfeldt et al.

(10) Patent No.: US 7,824,733 B2
(45) Date of Patent: Nov. 2, 2010

(54) WEAR-RESISTANT COATING AND PROCESS FOR PRODUCING IT

(75) Inventors: Tim Matthias Hosenfeldt, Nürnberg (DE); Martin Kramer, Hückeswagen (DE); Alexander Freiburg, Sundern (DE)

(73) Assignee: Schaeffler KG, Herzogenaurach (DE)

( * ) Notice: Subject to any disclaimer, the term of this patent is extended or adjusted under 35 U.S.C. 154(b) by 43 days.

(21) Appl. No.: 12/220,280

(22) Filed: Jul. 23, 2008

(65) Prior Publication Data
US 2008/0282836 A1 Nov. 20, 2008

Related U.S. Application Data

(62) Division of application No. 11/517,787, filed on Sep. 8, 2006, now abandoned.

(30) Foreign Application Priority Data
Sep. 10, 2005 (DE) ........................ 10 2005 043 108

(51) Int. Cl.
*C23C 16/32* (2006.01)
(52) U.S. Cl. ............ 427/249.1; 427/249.7; 427/249.17; 427/249.18; 427/249.19; 427/577
(58) Field of Classification Search ............... 427/249.7, 427/577, 249.1, 249.17, 249.18, 249.19; 204/192.1
See application file for complete search history.

(56) References Cited

U.S. PATENT DOCUMENTS

| 5,077,990 | A * | 1/1992 | Plath ........................... 66/123 |
| 5,237,967 | A * | 8/1993 | Willermet et al. ......... 123/90.51 |
| 6,860,255 | B2 * | 3/2005 | Yamaguchi et al. .......... 123/495 |
| 6,969,198 | B2 * | 11/2005 | Konishi et al. ................. 384/13 |
| 2003/0099416 | A1 * | 5/2003 | Kinno et al. ................. 384/492 |

OTHER PUBLICATIONS

Field, S.K., et al., "Tribological properties of graphite-like and diamond-like carbon coatings". Tribology International 37 (2004), pp. 949-956.*

* cited by examiner

*Primary Examiner*—Bret Chen
(74) *Attorney, Agent, or Firm*—Charles A. Muserlian

(57) ABSTRACT

A process for producing a wear-resistant coating and to a wear-resistant coating on predetermined surfaces (2) of machine or engine parts (1) consisting of a sintered material which are exposed to frictional wear, for fuel feed units in particular, comprising at least one metal-free amorphous hydrocarbon layer (5) with $sp^2$- and $sp^3$-hybridized carbon applied to the predetermined surface (2) of the machine or engine part (I) for reducing friction and increasing the wear resistance of the predetermined surface (2) of the machine or engine part (1), and at least one intermediate layer of a metal-containing hydrocarbon layer formed between the predetermined surface of the machine or engine part and the amorphous hydrocarbon layer wherein the metal is a combination of W, Ti, Hf and Ge.

11 Claims, 2 Drawing Sheets

WEAR-RESISTANT COATING AND PROCESS FOR PRODUCING IT

The application is a division of U.S. patent application Ser. No. 11/517,787 filed Sept. 8, 2006, now abandoned.

DESCRIPTION

The present invention relates to a wear-resistant coating on predetermined surfaces of machine or engine parts consisting of a sintered material which are exposed to frictional wear, and to a process for producing a wear-resistant coating of this type, in particular for machine or engine parts consisting of a sintered material in fuel feed units.

Although it can be applied to any desired machine or engine parts consisting of sintered material, the present invention and the object on which it is based are explained in more detail in connection with machine or engine parts of a sintered material for fuel feed units, in particular on the basis of a cam plate.

The applicant is familiar with fuel feed units which, for example in the case of a 4-, 5- and 10-cylinder tandem pump from LuK-Automobiltechnik, are based on the so-called rigid vane principle. This principle uses a cam plate, which is rotatably arranged in a middle plate of the feed unit and is in contact with an assigned mating surface of the middle plate by means of specific contact surfaces of the cam plate. Both the cam plate and the middle plate are preferably produced from a sintered material for reasons of cost. On account of the points of frictional contact occurring between the cam plate and the middle plate, radially occurring material wear at the corresponding contact surfaces occurs to a greater extent on the middle plate of the feed unit in the case of the 5- and 10-cylinder pumps.

It has been attempted to reduce this wear, i.e. the abrasion phenomena which occur under long-term loading of the contact partners, which generally bring about an undesired change of the surface resulting from tiny particles becoming detached as a result of mechanical and/or tribological causes, by subjecting the partners involved to thermochemical treatments to achieve certain properties. For example, the contact surfaces have been carbonitrided, nitrocarburized, nitrided and/or oxidized.

However, a disadvantage of this approach has been found to be the fact that, in spite of the thermochemical processes that are used, for example in spite of plasma nitrocarburizing of the middle plate, excessive, though reduced, wear continues to occur radially, in particular in the case of a 5- and 10-cylinder feed unit. A plasma nitrocarburizing process on the cam plate also entails a number of problems. To withstand the loads which act on the cam plate, after the sintering process it is quenched in an endothermic gas atmosphere and tempered at approximately 200° C. to 250° C. The plasma nitrocarburizing takes place at a temperature of approximately 550° C. to 590° C. In this case, the original hardness of the cam plate is lost and it has to be additionally induction-hardened at the loaded points. During coating at a process temperature which lies above the tempering temperature of the base material or the cam plate material, the microstructure of the cam plate changes, and consequently so do the finished dimensions of the same, which is extremely disadvantageous and undesired for constructional reasons.

Furthermore, components produced from a sintered material are very porous and therefore contain foreign substances, such as for example cooling lubricants or the like. These foreign substances have to be removed before the plasma nitrocarburizing, in order for the coating process not to be disturbed by outgassing of the substances. Consequently, a further process step is disadvantageously required. Furthermore, on account of the very uneven sintered metal surface of the cam plate, the applied wearing layer is not characterized by great uniformity in the case of nitrocarburizing, so that it may lead to spalling of the wearing layer. Furthermore, warping may also occur at the edges of the material.

Furthermore, a disadvantage of thermochemical processes, such as plasma nitrocarburizing for example, is that any bonding layers of a relatively high hardness have only a low hold on the cam plate of a relatively low material hardness, produced by the preheating treatment, so that any bonding layer may become detached from the cam plate in an undesired way.

Furthermore, the applicant is familiar with the approach of treating the contact surfaces of the components by means of a manganese-phosphating process or coating them with a sliding coating, or applying electroplated layers to the contact surfaces. Although the friction can be reduced, the wear resistance of such layers is low, so that the layer is removed. In the case of electroplated layers, moreover, the environmental impact is to be regarded as a disadvantageous factor.

Furthermore, the applicant is familiar with the approach of producing the component partners that are used from a hard metal or a high-speed steel. However, a disadvantage of this approach has been found to be the fact that these materials have an extremely high mass and can only be processed by very sophisticated production techniques.

The applicant is also familiar with applying layers with high surface hardnesses, such as for example TiN, CrN, (Ti, Al)N or the like, to the cam plate by means of PVD or (PA) CVD processes. However, a disadvantage of this approach has been found to be the fact that, on account of the higher friction occurring between the component partners and the increased surface hardness of the cam plate, the wear of the opposing body, i.e. the middle plate of the feed unit, is increased in a disadvantageous manner, so that the service life of the entire feed unit is reduced.

It has not previously been possible to provide sintered materials with firmly adhering coatings by means of PVD or (PA) CVD processes, since firstly, on account of the pores and the low hardness, the base material offers very poor support for the necessarily hard wear protection layer, and secondly, on account of the production techniques, mostly oily residues are outgassed from the pores of the sintered material in the vacuum coating process, as a result of which the coating process is disturbed or the wear protection layer cannot be made to bond to the base material.

The object of the present invention is consequently to provide a wear-resistant coating and a process for producing such a coating by which the aforementioned disadvantages are eliminated, and by which in particular a wear resistance is ensured throughout the entire service life of a fuel feed unit with a reduced friction coefficient.

This object is achieved according to the invention on the device side by a wear-resistant coating on predetermined surfaces of machine or engine parts comprising sintered materials which are exposed to frictional wear, in fuel feed units, comprising at least one metal-free amorphous hydrocarbon layer with $sp^2$- and $sp^3$- hybridized carbon applied to the predetermined surface of a machine or engine part for reducing friction and increasing the wear resistance of the predetermined surface of the machine or engine part and a process for producing the same comprising sintered materials which are exposed to frictional wear, in fuel feed units, comprising applying at least one metal-free amorphous hydrocarbon layer with $sp^2$- and $sp^3$- hybridized carbon to the predetermined surface of a machine or engine part for reducing friction and increasing the wear resistance of the predetermined surface of the machine or engine part.

The idea on which the present invention is based is that the wear-resistant coating on predetermined surfaces of machine or engine parts consisting of a sintered material which are exposed to frictional wear comprises at least one metal-free amorphous hydrocarbon layer with $sp^2$- $sp^3$-hybridized carbon applied to the predetermined surface of the machine or engine part for reducing friction and increasing the wear resistance of the predetermined surface of the machine or engine part.

Consequently, the present invention has the advantage over the prior art that the wear resistance, for example in the contact region between the cam plate and the middle plate in a fuel feed unit, is increased in comparison with the prior art. Furthermore, a reduction of the friction in the sliding contact with the middle plate is ensured in comparison with the prior art.

A further advantage is that the properties of the cam plate or the sintered material with respect to the microstructure and the function-related component tolerances are advantageously unchanged when the wear-resistant coating according to the invention is applied. Consequently, use of the wear-resistant coating according to the invention makes it possible to revert to the low-cost sintered material as a substrate, so that the component can be competitively produced by the sintering process. The coating applied to the sintered material represents a coating which has adhesive strength and wear resistance, does not change the properties of the component and advantageously prolongs the service life of the friction partners, and consequently of the feed unit.

Advantageous refinements and improvements of the wear-resistant coating.

According to a preferred development, the amorphous hydrocarbon layer has a hydrogen fraction of at most 20 atomic %. As a result, the predetermined surface of the machine or engine part or of the cam plate has little tendency to adhere to the metallic opposing body, i.e. the middle plate, a high abrasive wear resistance, a high chemical resistance, high mechanical strengths and high hardness/modulus of elasticity ratios. A higher hydrogen fraction could lead to undesired bonds with lubricants or the like.

The amorphous hydrocarbon layer preferably has process-related impurities, for example O or Ar atoms, metals or the like, of less than 1 atomic %.

According to a further preferred exemplary embodiment, the overall coating has a thickness of approximately 2.0 µm to 5.0 µm, the amorphous hydrocarbon layer preferably having a thickness of 1.0 µm to 4.0 µm. Such layer thicknesses change the dimensions of the machine or engine parts to such a small degree that no further processing is necessary and the surface structure or topography which has been set is retained.

According to a further preferred development, at least one intermediate layer or at least one adhesion promoting layer or a combination of these two is provided between the predetermined surface of the machine or engine part and the amorphous hydrocarbon layer. The at least one intermediate layer is in this case preferably formed as a metal-containing hydrocarbon layer, the metal components comprising W, Ti, Hf, Ge or a combination of the aforementioned components. The intermediate layer preferably has a thickness of approximately 0.5 µm to 2.0 µm. The at least one adhesion promoting layer preferably comprises metallic substances, borides, carbides and/or nitrides of the transition metals. The adhesion promoting layer preferably has a thickness of approximately 0.1 µm to 0.5 µm.

According to a further preferred exemplary embodiment, the amorphous hydrocarbon layer is deposited on the predetermined surface of the machine or engine part by means of a PVD or a (PA) CVD process. Depositing of the at least one intermediate layer and/or the at least one adhesion promoting layer preferably takes place by means of a PVD process.

Preferably, no thermal and/or mechanical further processing of the deposited amorphous hydrocarbon layer is carried out.

According to a further preferred exemplary embodiment, the predetermined surface of the machine or engine part consists of a hardened sintered steel. Consequently, it is possible to revert to the low-cost sintered steel as a substrate and for the machine or engine part to be competitively produced by the sintering process.

Before depositing of the amorphous hydrocarbon layer, the predetermined surface of the machine or engine part preferably undergoes cleaning, for example bath cleaning in various cleaning baths, with a subsequent outgassing operation in a cleaning oven or the like. As a result, permanent adhesion of the coating to the base body is ensured.

According to a further preferred exemplary embodiment, the amorphous hydrocarbon layer, the at least one intermediate layer and/or the at least one adhesion promoting layer are deposited at in each case a coating temperature respectively less than the tempering temperature of the machine or engine part. The outgassing temperature of any outgassing operation also advantageously lies below the tempering temperature of the machine or engine part. As a result, the machine or engine part does not experience any loss of hardness or any distortion.

Examples of uses for the wear-resistant coating are the contact surfaces of a cam plate with respect to a middle plate of a diesel feed unit of an internal combustion engine, the cam plate being produced from a sintered material. However, it is also possible for middle plates, valve gear components, such as for example bucket tappets, hydraulic supporting and insertion elements, rolling bearing components, control pistons, release bearings, piston pins, bearing bushes, linear guides or the like, consisting of a sintered material, to be provided with a wear-resistant coating of this type.

The invention is explained in more detail below on the basis of exemplary embodiments and with reference to the appended figures of the drawing, in which.

In the figures, the same reference numerals denote components that are the same or functionally the same, unless otherwise stated.

Figure 1:
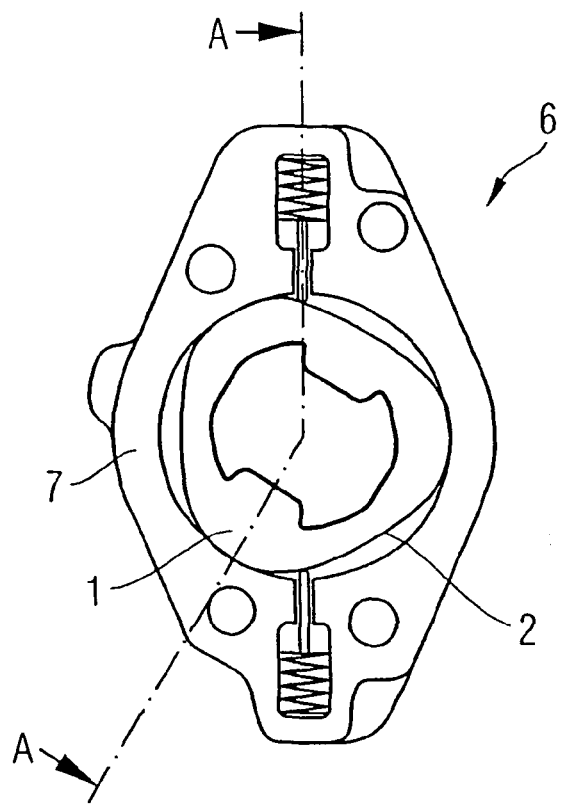
FIG. 1 shows a plan view of a diesel feed unit according to an exemplary embodiment of the present invention.
Figure 2:
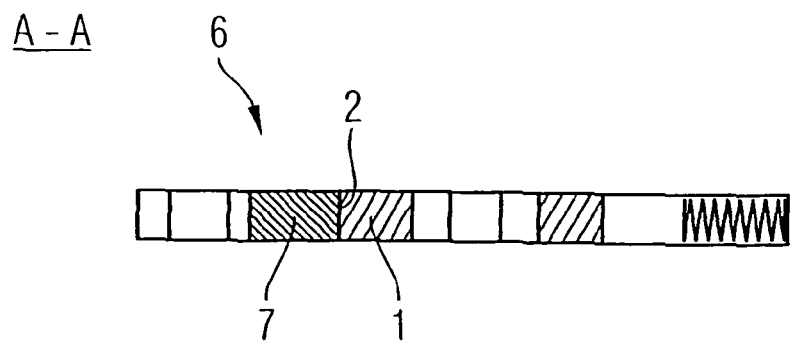
FIG. 2 shows a cross-sectional view of the diesel feed unit from FIG. 1 along the section line A-A.

FIG. 1 illustrates a plan view of a diesel feed unit 6 and FIG. 2 illustrates a cross-sectional view along the line A-A of the diesel feed unit 6 from FIG. 1 according to a preferred exemplary embodiment of the present invention. The diesel feed unit 6 has a middle plate 7, in which a cam plate 1 rotates, forming frictional contact surfaces between the cam plate 1 and the middle plate 7 for operating a tandem pump system, for example based on a rigid vane principle. When this happens, material wear occurs, in particular at the contact surfaces between the cam plate 1 and the middle plate 7 of the feed unit 6, on account of the frictional forces occurring.

It is desirable to provide these contact surfaces 2 of the cam plate 1 with wear protection or a wear-resistant coating, in order to increase the wear resistance of the cam plate 1 for a prolonged service life of the same.

Figure 3:
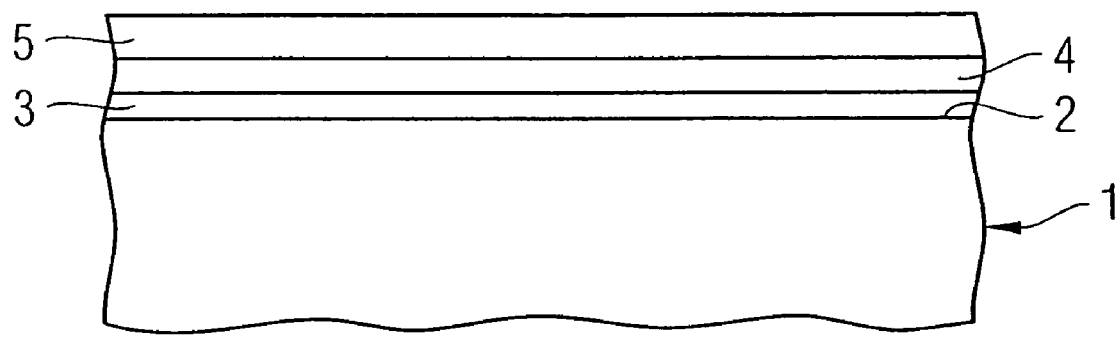
FIG. 3 shows an enlarged view of the wear-resistant coating according to a preferred exemplary embodiment of the present invention, deposited on the contact surface of the cam plate with respect to the middle plate.

FIG. 3 illustrates an enlarged representation of a detail of the cam plate 1 from FIG. 1. As can be seen in FIG. 3, a wear-resistant coating 3, 4, 5 is provided on a predetermined surface 2 of the cam plate 1 to increase the wear resistance and to reduce the friction torque.

According to a preferred exemplary embodiment of the present invention, a metallic base body of a sintered material, in particular of a hardened sintered material, is used as the base body of the cam plate 1.

Using such base body materials makes it possible to revert to conventional production technologies and for the base body to be competitively produced in a sintering process.

As further illustrated in FIG. 2, an adhesion promoting layer 3 is applied to a predetermined surface or to the contact surface 2 of the cam plate 1 with respect to the middle plate 7. The adhesion promoting layer 3 may be deposited on the predetermined surface 2 of the cam plate 1 for example by means of a PVD process (Physical Vapour Deposition). The adhesion promoting layer 3 preferably comprises metallic substances, borides, carbides and nitrides of the transition metals or the like and preferably has a thickness of 0.1 μm to 0.5 μm. The adhesion promoting layer 3 serves for improved attachment or improved crosslinking of the atoms of an intermediate layer or functional layer to be subsequently applied on the base body 1. The thickness of the adhesion promoting layer 3 is to be selected on the basis of the intermediate layer 4 that is used, or customer wishes and requirements.

According to the present exemplary embodiment, an intermediate layer 4 is subsequently deposited on the adhesion promoting layer 3, as can be seen in FIG. 3, for example likewise by means of a PVD process. The intermediate layer 4 may for example be applied as a metal-containing hydrocarbon layer (Me—C:H), it being possible for the metal components W, Ti, Hf, Ge or the like to occur individually or more than one together. The intermediate layer 4 has, for example, a thickness of approximately 0.5 μm to 2.0 μm and serves for improved attachment of the functional layer on the adhesion promoting layer 3, or in the case where there is no adhesion promoting layer 3 for improved attachment of the functional layer on the base body 1 from a physical, mechanical and chemical viewpoint. The thickness of the intermediate layer 4 is in this case once again to be adapted to compositions of the layers used and to the respective requirements.

As further represented in FIG. 3, the actual functional layer 5 is subsequently deposited on the intermediate layer 4. In this case, the functional layer 5 may either be deposited directly on the base body 1, directly on the adhesion promoting layer 3 or, as represented in FIG. 3, directly on the intermediate layer 4. A special transition from the intermediate layer 4 to the functional layer 5 is preferably developed, ensuring optimum bonding of the functional layer 5 and inducing lowest possible stresses in the layer system or in the critical interface between the porous base material and the layer system, thereby avoiding spalling, both in a cohesive form and in an adhesive form. It should be pointed out at this stage that, in the case of certain application areas, it is also possible to dispense with the adhesion promoting layer 3 and/or the intermediate layer 4.

The functional layer 5 is formed as an amorphous hydrocarbon layer (a-C:H) and is preferably deposited on an intended layer, according to the present exemplary embodiment on the intermediate layer 4, by means of a PVD and/or (PA) CVD process (Plasma Assisted Chemical Vapour Deposition).

In the case of a PVD process, a starting material, for example graphite, is heated in such a way that a stream of high-energy carbon ions is emitted from the graphite and guided in the direction of the surface to be coated. In this case, the surface to be coated may be guided past the stream of high-energy ions once or more than once in a process chamber, to form one or more layers.

In the case of a (PA) CVD process, a plasma is used to introduce a gas mixture into the process chamber, in which the material parts to be coated are present. At predetermined temperatures, the gases introduced react chemically with one another and lead to a thin condensed layer on the surfaces of the material parts to be coated.

The task of the complete layer system, comprising the base body 1, the adhesion promoting layer 3, the intermediate layer 4 and the amorphous hydrocarbon layer 5, is to reduce the friction between this coating and an opposing body, for example the middle plate 7 of the fuel feed unit 6, and increase the service life of the coated cam plate 1 and also that of the opposing body.

The amorphous hydrocarbon layer 5 therefore preferably has a hydrogen fraction of at most 20 atomic %, whereby little tendency to adhere to the metallic opposing body, a high abrasive wear resistance, a high chemical resistance, high mechanical strengths and high hardness/modulus of elasticity ratios are ensured. Otherwise, the amorphous hydrocarbon layer 5 comprises $sp^2$- and $sp^3$-hybridized carbon, process-related impurities of less than 1 atomic % preferably being provided.

The amorphous hydrocarbon layer 5 preferably has a layer thickness of approximately 1.0 μm to 4.0 μm. The total thickness of the coating, comprising the individual layers 3, 4 and 5, is preferably approximately 2.0 μm to 5.0 μm. Such a thickness of the entire coating changes the dimensions of the machine or engine part or the cam plate 1 to such a small degree that no further processing is necessary and the surface structure or topography which has been set is retained. The tribological tasks are undertaken by the surface of the coating, which by the set structure reduces the area of mixed friction and on account of the low-friction coating reduces the frictional force, and consequently the loads to which the surface is subjected. The mechanical tasks, on the other hand, are undertaken by the layer system together with the base body.

The opposing body, in the present case for example the middle plate 7 of the feed unit 6, may, in the interests of lightweight construction and cost saving, preferably be created from iron-carbon alloys. In addition, low-viscosity, low-additive oils can be used. Furthermore, minimal lubrication or an extended oil change interval can be accomplished.

Before coating of the base body, the predetermined area 2 of the same is preferably cleaned, for example by means of bath cleaning in various cleaning baths, with a subsequent outgassing operation in a cleaning oven or the like. As a result, the adhesive property of the coating on the base body is advantageously improved.

The coating temperature of the individual coating operations is around 200° C. and the outgassing temperature for the outgassing operation of the base body is around 240° C. These temperature ranges consequently lie below the tempering temperature of the sintered material of the cam plate 1. As a result, the cam plate 1 advantageously does not undergo any loss of hardness or any distortion.

The present invention consequently provides a wear-resistant coating and a process for producing such a wear-resistant coating, it being possible to revert to the low-cost sintered material as a substrate, which however would not withstand the tribological loading without the coating according to the invention. On account of the necessary complex geometry of the parts, it is consequently advantageous for production reasons that a sintered material with a coating according to the invention can be used, so that the component can be competitively produced by the sintering process. On account of the low total layer thickness, the coating can be applied very uniformly and without any appreciable increase in roughness. As a result, the coating is possible without a specified allowance and without cost-intensive further processing.

The coating described above creates a tribological system which by the set structure reduces the area of mixed friction and on account of the low-friction coating reduces the frictional force, and consequently the loads to which the surface is subjected, and also increases the wear resistance.

Apart from coating contact surfaces of cam plates in feed units, it goes without saying that it is also possible for other engine or machine parts, for example in addition the opposing body, i.e. the middle plate, other valve gear components, such as for example bucket tappets, hydraulic supporting and insertion elements, rolling bearing components, control pistons, release bearings, piston pins, bearing bushes, linear guides or the like, to be coated according to the invention.

Although the present invention has been described above on the basis of preferred exemplary embodiments, it is not restricted to these but can be modified in various ways.

LIST OF DESIGNATIONS

1 Machine or engine part/cam plate
2 Predetermined surface of the machine or engine part/contact surface of the cam plate with respect to the middle plate
3 Adhesion promoting layer
4 Intermediate layer
5 Amorphous hydrocarbon layer/functional layer
6 Fuel feed unit
7 Middle plate

The invention claimed is:

1. A process for producing a wear-resistant coating on predetermined surfaces of machine or engine parts comprising sintered materials which are exposed to frictional wear, in fuel feed units, comprising applying at least one metal-free amorphous hydrocarbon layer with $sp^2$- and $sp^3$-hybridized carbon to the predetermined surface of a machine or engine part (1) for reducing friction and increasing the wear resistance of the predetermined surface of the machine or engine part, and at least one intermediate layer of metal-containing hydrocarbon layer formed between the predetermined surface of the machine or engine part and the amorphous hydrocarbon layer wherein the metal is a combination of W, Ti, Hf and Ge.

2. The process of claim 1, wherein the amorphous hydrocarbon layer is deposited onto the predetermined surface of the machine or engine part by means of a PVD and/or a (PA) CVD process.

3. The process of claim 1 wherein the amorphous hydrocarbon layer is formed with a hydrogen fraction of at most 20 atomic %.

4. The process of claim 1 wherein the amorphous hydrocarbon layer is formed with process-related impurities of less than 1 atomic %.

5. The process of claim 1 wherein the amorphous hydrocarbon layer is formed with a thickness of approximately 1.0 μm to 4.0 μm.

6. The process of claim 1 wherein, before depositing of the amorphous hydrocarbon layer, the predetermined surface of the machine or engine part undergoes cleaning, in various cleaning baths, with a subsequent outgassing operation in a cleaning oven.

7. The process of claim 1 wherein at least one adhesion promoting layer and/or at least one intermediate layer is formed between the predetermined surface of the machine or engine part and the amorphous hydrocarbon layer.

8. The process of claim 7 wherein at least one intermediate layer is formed with a thickness of approximately 0.5 μm to 2.0 μm.

9. The process of claim 7 wherein at least one adhesion promoting layer is formed from at least one member of the group consisting of substances, borides, carbides and nitrides of the transition metals.

10. The process of claim 7 wherein at least one adhesion promoting layer is formed with a thickness of approximately 0.1 μm to 0.5 μm.

11. The process of claim 1 wherein the amorphous hydrocarbon layer at least one intermediate layer and/or at least one adhesion promoting layer are deposited at in each case a coating temperature respectively less than the tempering temperature of the machine or engine part.

* * * * *